(12) United States Patent
Genji et al.

(10) Patent No.: US 10,812,047 B2
(45) Date of Patent: Oct. 20, 2020

(54) ELASTIC WAVE FILTER APPARATUS

(71) Applicant: Murata Manufacturing Co., Ltd., Nagaokakyo-shi, Kyoto-fu (JP)

(72) Inventors: Takuma Genji, Nagaokakyo (JP); Akio Kaneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 19 days.

(21) Appl. No.: 16/224,948

(22) Filed: Dec. 19, 2018

(65) Prior Publication Data

US 2019/0123715 A1 Apr. 25, 2019

Related U.S. Application Data

(63) Continuation of application No. PCT/JP2017/016472, filed on Apr. 26, 2017.

(51) Int. Cl.
| | | |
|---|---|---|
| *H03H 9/54* | (2006.01) |
| *H03H 9/64* | (2006.01) |
| *H03H 9/72* | (2006.01) |
| *H03H 9/25* | (2006.01) |
| *H03H 9/60* | (2006.01) |

(Continued)

(52) U.S. Cl.
CPC ............ *H03H 9/25* (2013.01); *H03H 9/542* (2013.01); *H03H 9/568* (2013.01); *H03H 9/605* (2013.01); *H03H 9/6483* (2013.01); *H03H 9/706* (2013.01); *H03H 9/725* (2013.01)

(58) Field of Classification Search
CPC ............ H03H 9/54; H03H 9/64; H03H 9/72
See application file for complete search history.

(56) References Cited

U.S. PATENT DOCUMENTS

| | | | | | |
|---|---|---|---|---|---|
| 7,116,187 | B2 * | 10/2006 | Inoue | ................... | H03H 9/0576 |
| | | | | | 333/133 |
| 8,902,020 | B2 * | 12/2014 | Bradley | ................. | H03H 9/725 |
| | | | | | 333/133 |
| 9,595,940 | B2 * | 3/2017 | Ri | ......................... | H03H 9/0004 |

(Continued)

FOREIGN PATENT DOCUMENTS

| | | |
|---|---|---|
| JP | 2012-244551 A | 12/2012 |
| JP | 2015-033080 A | 2/2015 |

(Continued)

OTHER PUBLICATIONS

Official Communication issued in International Patent Application No. PCT/JP2017/016472, dated Jun. 20, 2017.

*Primary Examiner* — Dean O Takaoka
*Assistant Examiner* — Alan Wong
(74) *Attorney, Agent, or Firm* — Keating & Bennett, LLP

(57) ABSTRACT

An elastic wave filter apparatus includes a transmission-side filter, a reception-side filter, an antenna terminal, and a matching circuit. The matching circuit is connected between a common node of the transmission-side filter and the reception-side filter and the antenna terminal. The transmission-side filter includes a ladder circuit and filter inductors. The matching circuit includes a matching inductor. The ladder circuit includes series arm resonators and parallel arm resonators. The matching inductor is connected between a transmission line connecting the common node and the antenna terminal and a first terminal of the filter inductor on the side of the parallel arm resonator.

7 Claims, 2 Drawing Sheets

(51) Int. Cl.
*H03H 9/56* (2006.01)
*H03H 9/70* (2006.01)

(56) References Cited

U.S. PATENT DOCUMENTS

| | | |
|---|---|---|
| 9,929,770 B2 * | 3/2018 | Onodera ............. H04M 1/0202 |
| 2015/0042417 A1 | 2/2015 | Onodera et al. |
| 2015/0137909 A1 | 5/2015 | Okuda et al. |
| 2015/0381142 A1 | 12/2015 | Ri |
| 2017/0222617 A1 | 8/2017 | Mizoguchi |

FOREIGN PATENT DOCUMENTS

| | | |
|---|---|---|
| JP | 2016-012796 A | 1/2016 |
| WO | 2014/034373 A1 | 3/2014 |
| WO | 2016/060151 A1 | 4/2016 |

* cited by examiner

ELASTIC WAVE FILTER APPARATUS

CROSS REFERENCE TO RELATED APPLICATIONS

This application claims the benefit of priority to Japanese Patent Application No. 2016-125109 filed on Jun. 24, 2016 and is a Continuation Application of PCT Application No. PCT/JP2017/016472 filed on Apr. 26, 2017. The entire contents of each application are hereby incorporated herein by reference.

BACKGROUND OF THE INVENTION

1. Field of the Invention

The present invention relates to an elastic wave filter apparatus including a plurality of elastic wave resonators and inductors.

2. Description of the Related Art

Japanese Unexamined Patent Application Publication No. 2012-244551 discloses, as a type of an elastic wave filter apparatus, a duplexer including a plurality of surface acoustic wave resonators. The duplexer disclosed in Japanese Unexamined Patent Application Publication No. 2012-244551 includes a transmission-side filter and a reception-side filter.

The transmission-side filter includes a plurality of series arm resonators, a plurality of parallel arm resonator, and a plurality of inductors. The series arm resonators and the parallel arm resonators are connected in a ladder configuration. Each of the inductors is connected between a corresponding one of the parallel arm resonators and the ground.

The reception-side filter includes a plurality of series arm resonators, a plurality of parallel arm resonators, and a plurality of inductors similar to the transmission-side filter. The series arm resonators and the parallel arm resonators are connected in a ladder configuration. Each of the inductors is connected between a corresponding one of the parallel arm resonators and the ground.

The transmission-side filter and the reception-side filter are connected to an antenna via a matching circuit. The matching circuit includes a matching inductor. The matching inductor is connected between the ground and a transmission line that connects the transmission-side filter and the reception-side filter to the antenna.

A duplexer having such a circuit configuration includes of a piezoelectric device and a circuit board at which the piezoelectric device is disposed. In the piezoelectric device, a plurality of series arm resonators and a plurality of parallel arm resonators are formed. At the circuit board, a plurality of inductors of a transmission-side filter, a plurality of inductors of a reception-side filter, and a matching inductor are disposed or formed.

The inductance of the matching inductor is larger than those of the inductors of the transmission-side filter and the reception-side filter.

In a case in which the matching inductor is formed at the circuit board, the footprint of the matching inductor at the circuit board therefore becomes large. This leads to difficulty in miniaturizing the circuit board and a reduction in design freedom of the circuit board.

SUMMARY OF THE INVENTION

Preferred embodiments of the present invention provide elastic wave filter apparatuses that each have a high degree of design freedom of a circuit board and that are able to be miniaturized.

An elastic wave filter apparatus according to a preferred embodiment of the present invention includes an antenna terminal, a plurality of bandpass filters, and a matching circuit. The antenna terminal is connected to an antenna. The bandpass filters are connected in common to the antenna terminal. The matching circuit is connected between the antenna terminal and a common node of the bandpass filters. At least one of the bandpass filters includes a ladder circuit and a filter inductor. The ladder circuit includes at least one series arm resonator defined by an elastic wave resonator and at least one parallel arm resonator defined by an elastic wave resonator. The filter inductor is connected between the at least one parallel arm resonator and a ground potential. The matching circuit includes a matching inductor. The matching inductor is connected between a transmission line connecting the common node and the antenna terminal and a terminal of the filter inductor on a side of the parallel arm resonator.

With this configuration, an inductor for the matching circuit is defined by the matching inductor and the filter inductor connected to the matching inductor. Accordingly, the inductance of the matching inductor becomes smaller as compared with a case in which a desired inductance of a matching circuit is achieved by only a matching inductor.

An elastic wave filter apparatus according to a preferred embodiment of the present invention preferably has the following configuration. The at least one parallel arm resonator includes a plurality of parallel arm resonators. The filter inductor includes a first filter inductor and a second filter inductor. The first filter inductor is connected to only one of the parallel arm resonators. The matching inductor is connected between the transmission line and the first filter inductor.

With this configuration, a change in the characteristics of a transmission-side filter which is caused by the connection between the matching inductor and the first filter inductor becomes small.

In an elastic wave filter apparatus according to a preferred embodiment of the present invention, the parallel arm resonator to which the first filter inductor is connected is preferably nearer to the common node than a parallel arm resonator to which the second filter inductor is connected.

With this configuration, a change in the characteristics of a transmission-side filter which is caused by the connection between the matching inductor and the first filter inductor becomes even smaller.

In an elastic wave filter apparatus according to a preferred embodiment of the present invention, the at least one of the bandpass filters may be a transmission-side filter.

With this configuration, the inductance of the matching inductor becomes small by using the filter inductor in the transmission-side filter that commonly includes a ladder circuit.

According to preferred embodiments of the present invention, elastic wave filter apparatuses that each have a high degree of design freedom of a circuit board and that are able to be miniaturized are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
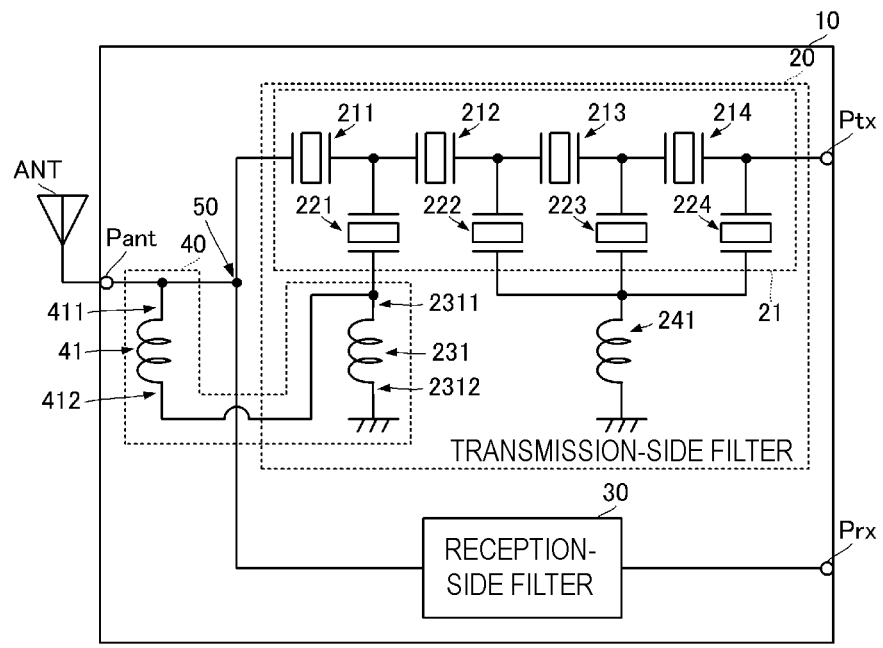
FIG. 1 is a circuit diagram of an elastic wave filter apparatus according to a preferred embodiment of the present invention.
Figure 2:
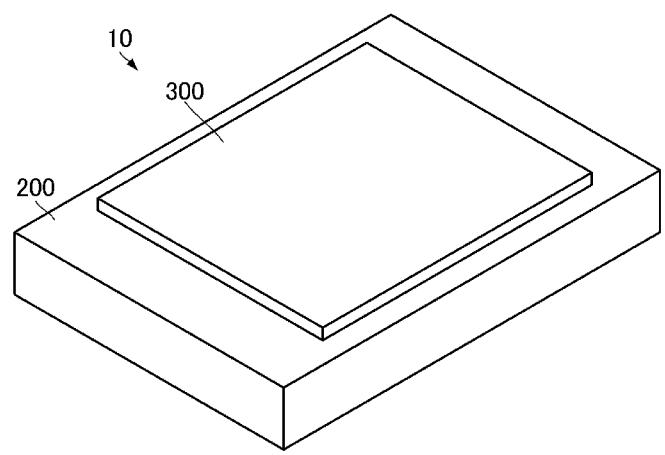
FIG. 2 is a schematic diagram of an elastic wave filter apparatus according to a preferred embodiment of the present invention.

Elastic wave filter apparatuses according to preferred embodiments of the present invention will be described with reference to the accompanying drawings. FIG. 1 is a circuit diagram of an elastic wave filter apparatus according to a preferred embodiment of the present invention. FIG. 2 is a schematic diagram of an elastic wave filter apparatus according to a preferred embodiment of the present invention.

As illustrated in FIG. 1, an elastic wave filter apparatus 10 includes a transmission-side filter 20, a reception-side filter 30, a matching circuit 40, a transmission terminal Ptx, a receiving terminal Prx, and an antenna terminal Pant. The elastic wave filter apparatus 10 further includes a common node 50 between the transmission-side filter 20 and the reception-side filter 30. The elastic wave filter apparatus 10 is preferably a duplexer, for example.

An antenna ANT is connected to the antenna terminal Pant. A transmission-side circuit (not illustrated) to generate and amplify a transmission signal in a high-frequency communication band is connected to the transmission-side filter 20. A reception-side circuit (not illustrated) to amplify and decode a reception signal in a high-frequency communication band is connected to the reception-side filter 30.

The transmission-side filter 20 is connected between the transmission terminal Ptx and the common node 50. The reception-side filter 30 is connected between the receiving terminal Prx and the common node 50. The matching circuit 40 is connected between the antenna terminal Pant and the common node 50.

The transmission-side filter 20 includes a ladder circuit 21 and filter inductors 231 and 241. The ladder circuit 21 includes a plurality of series arm resonators 211, 212, 213, and 214 and a plurality of parallel arm resonators 221, 222, 223, and 224. Each of the series arm resonators 211, 212, 213, and 214 and the parallel arm resonators 221, 222, 223, and 224 is an elastic wave resonator. More specifically, each of the series arm resonators 211, 212, 213, and 214 and the parallel arm resonators 221, 222, 223, and 224 is preferably a surface acoustic wave resonator, for example. The filter inductor 231 corresponds to a "first filter inductor". The filter inductor 241 corresponds to a "second filter inductor".

The frequency characteristics of the transmission-side filter 20 are set such that a transmission signal frequency band is in a pass band and a reception signal frequency band is in an attenuation band. The transmission-side filter 20 is preferably a bandpass filter, for example.

The series arm resonators 211, 212, 213, and 214 are connected in series between the common node 50 and the transmission terminal Ptx. Specifically, the series arm resonator 211 is connected to the common node 50. The series arm resonator 212 is connected to the series arm resonator 211. The series arm resonator 213 is connected to the series arm resonator 212. The series arm resonator 214 is connected to the series arm resonator 213. The series arm resonator 214 is connected to the transmission terminal Ptx.

A first terminal of the parallel arm resonator 221 is connected to a transmission line that connects the series arm resonators 211 and 212. A first terminal of the parallel arm resonator 222 is connected to a transmission line that connects the series arm resonators 212 and 213. A first terminal of the parallel arm resonator 223 is connected to a transmission line that connects the series arm resonators 213 and 214. A first terminal of the parallel arm resonator 224 is connected to a transmission line that connects the series arm resonator 214 and the transmission terminal Ptx.

A first terminal 2311 of the filter inductor 231 is connected to a second terminal of the parallel arm resonator 221. A second terminal 2312 of the filter inductor 231 is connected to a ground potential. Thus, the filter inductor 231 is connected to only a single parallel arm resonator, the parallel arm resonator 221.

The filter inductor 231 is connected to the parallel arm resonator 221 that is nearer to the common node 50 than the parallel arm resonators 222, 223, and 224. That is, the parallel arm resonator 221 to which the filter inductor 231 is connected is nearest to the common node 50 of the parallel arm resonators 221, 222, 223, and 224 of the transmission-side filter 20.

A first terminal of the filter inductor 241 is connected to the respective second terminals of the parallel arm resonators 222, 223, and 224. A second terminal of the filter inductor 241 is connected to a ground potential.

Although the detailed circuit configuration of the reception-side filter 30 is not illustrated, the reception-side filter 30 includes a plurality of elastic wave resonators. The frequency characteristics of the reception-side filter 30 are set such that a reception signal frequency band is in a pass band and a transmission signal frequency band is in an attenuation band. The reception-side filter 30 is preferably a bandpass filter, for example.

The matching circuit 40 includes a matching inductor 41. A first terminal 411 of the matching inductor 41 is connected to a transmission line that connects the antenna terminal Pant and the common node 50. A second terminal 412 of the matching inductor 41 is connected to the first terminal 2311 of the filter inductor 231.

The matching circuit 40 has a configuration in which a series circuit including the matching inductor 41 and the filter inductor 231 is connected between the ground and the transmission line that connects the antenna terminal Pant and the common node 50.

The elastic wave filter apparatus 10 having the above-described configuration includes a circuit board 200 and a piezoelectric device 300 as illustrated in FIG. 2. The circuit board 200 includes a conductive pattern provided on the outer surface of a dielectric substrate or in the dielectric substrate. With this configuration, the filter inductors 231 and 241, the matching inductor 41, the transmission terminal Ptx, the receiving terminal Prx, and the antenna terminal Pant are provided at the circuit board 200.

The piezoelectric device 300 includes a piezoelectric substrate and an IDT (interdigital transducer) electrode. With this configuration, the series arm resonators 211, 212, 213, and 214 and the parallel arm resonators 221, 222, 223, and 224 included in the transmission-side filter 20 and the elastic wave resonators included in the reception-side filter 30 are provided. The piezoelectric device 300 and the circuit board 200 are connected by a connection conductor, such as wire bonding (not illustrated), for example.

With the above-described configuration, the inductance of the matching circuit 40 is a result of the addition of the inductances of the matching inductor 41 and the filter inductor 231. Accordingly, the inductance of the matching inductor 41 in the elastic wave filter apparatus 10 is able to be reduced without changing the impedance of the matching circuit 40.

As a result, the footprint of the matching inductor 41 at the circuit board 200 in the elastic wave filter apparatus 10 is able to be reduced. This leads to the improvement of design freedom of the circuit board 200 and the miniaturization of the elastic wave filter apparatus 10.

Figure 3A:
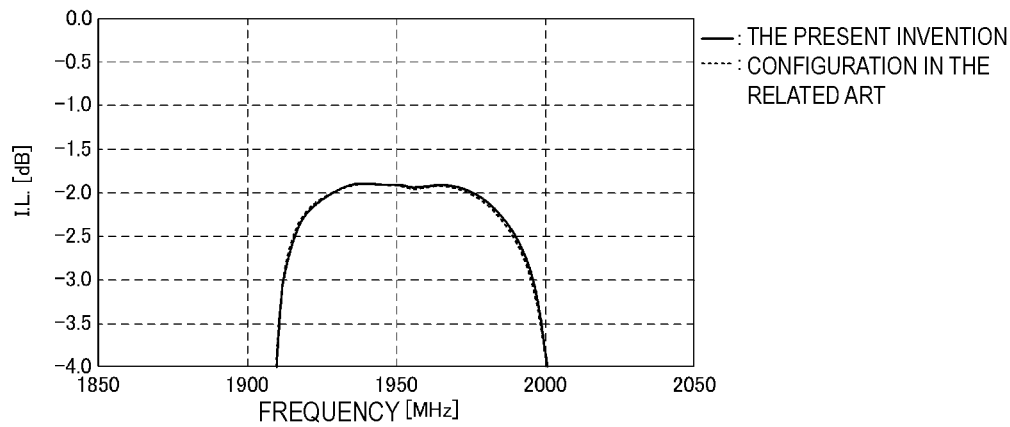
FIG. 3A is a diagram illustrating the frequency characteristics of the insertion loss between a transmission terminal Ptx and an antenna terminal Pant in an elastic wave filter apparatus according to a preferred embodiment of the present invention.
Figure 3B:
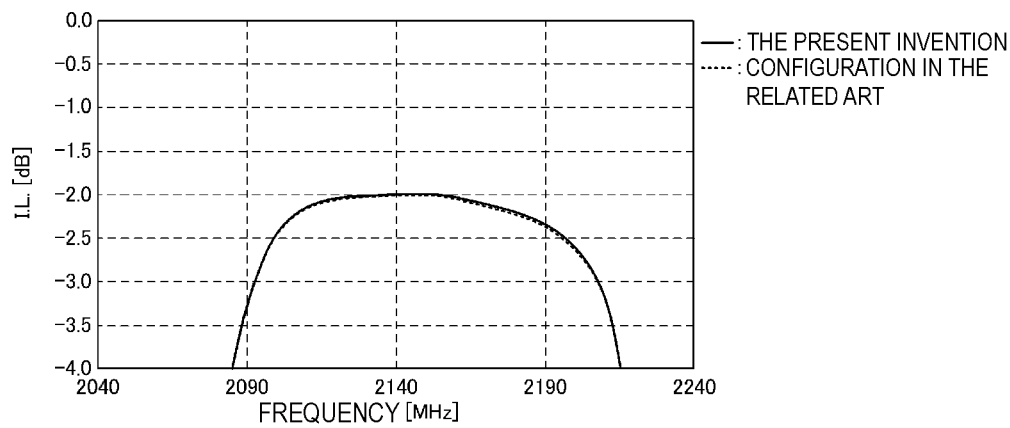
FIG. 3B is a diagram illustrating the frequency characteristics of the insertion loss between the antenna terminal Pant and a receiving terminal Prx in the elastic wave filter apparatus according to a preferred embodiment of the present invention.
Figure 3C:
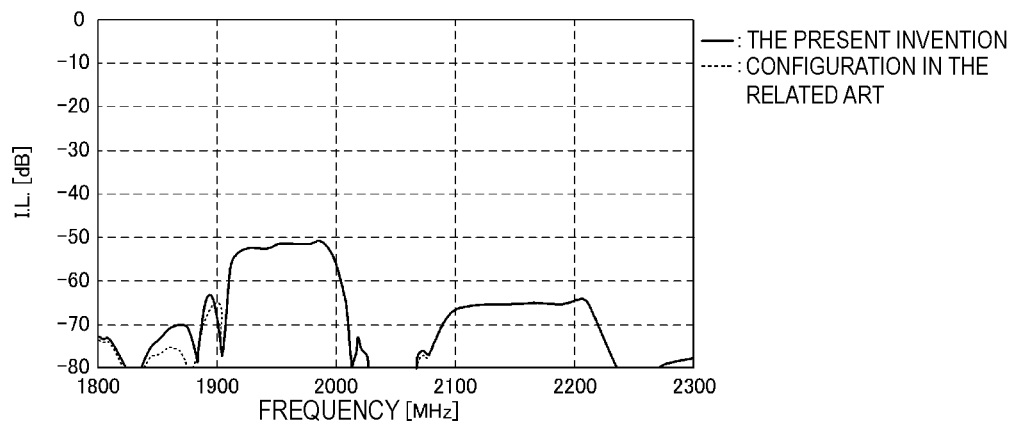
FIG. 3C is a diagram illustrating the frequency characteristics of the insertion loss between the transmission terminal Ptx and the receiving terminal Prx in the elastic wave filter apparatus according to a preferred embodiment of the present invention.

FIG. 3A is a diagram illustrating the frequency characteristics of the insertion loss between the transmission terminal Ptx and the antenna terminal Pant in an elastic wave filter apparatus according to a preferred embodiment of the present invention. FIG. 3B is a diagram illustrating the frequency characteristics of the insertion loss between the antenna terminal Pant and the receiving terminal Prx in the elastic wave filter apparatus according to a preferred embodiment of the present invention. FIG. 3C is a diagram illustrating the frequency characteristics of the insertion loss between the transmission terminal Ptx and the receiving terminal Prx in the elastic wave filter apparatus according to a preferred embodiment of the present invention. A configuration in the related art illustrated in FIGS. 3A to 3C is the same or substantially the same as the configuration disclosed in Japanese Unexamined Patent Application Publication No. 2012-244551.

As illustrated in FIG. 3A, by using the configuration of the elastic wave filter apparatus 10 according to the present preferred embodiment, the insertion loss of a transmission signal that is the same or substantially the same as that obtained with the configuration in the related art is able to be obtained. That is, the elastic wave filter apparatus 10 according to the present preferred embodiment is able to transmit a transmission signal from the transmission terminal Ptx to the antenna terminal Pant with a low loss that is the same or substantially the same as a loss in a case in which the configuration in the related art is used.

As illustrated in FIG. 3B, by using the configuration of the elastic wave filter apparatus 10 according to the present preferred embodiment, the insertion loss of a reception signal that is the same or substantially the same as that obtained with the configuration in the related art is able to be obtained. That is, the elastic wave filter apparatus 10 according to the present preferred embodiment is able to transmit a reception signal from the antenna terminal Pant to the receiving terminal Prx with a low loss that is the same or substantially the same as a loss in a case in which the configuration in the related art is used.

As illustrated in FIG. 3C, by using the configuration of the elastic wave filter apparatus 10 according to the present preferred embodiment, the insertion losses of a transmission signal and a reception signal that are the same or substantially the same as those obtained with the configuration in the related art is able to be obtained. That is, the elastic wave filter apparatus 10 according to the present preferred embodiment is able to ensure the degree of isolation between the transmission terminal Ptx and the receiving terminal Prx that is the same or substantially the same as that obtained with the configuration in the related art in both of a transmission signal frequency band and a reception signal frequency band.

Thus, the elastic wave filter apparatus 10 according to the present preferred embodiment is able to obtain filter characteristics that are the same or substantially the same as those obtained with a circuit configuration in which a matching circuit is defined by only a matching inductor e.g. the configuration in the related art. That is, the improvement of the design freedom of a circuit and the miniaturization of the elastic wave filter apparatus 10 is able to be achieved while excellent filter characteristics that are the same or substantially the same as those obtained with a configuration in the related art is achieved.

In the present preferred embodiment, the matching inductor 41 is connected to the filter inductor 231 connected to the parallel arm resonator 221 that is nearest to the common node 50 of the parallel arm resonators in the transmission-side filter 20. However, even in a case in which the matching inductor 41 is connected to another filter inductor in the transmission-side filter 20, a similar advantageous effect is able to be obtained. However, it should be noted that the use of a configuration according to the present preferred embodiment is able to further reduce the influence of the connection between the matching inductor 41 and a filter inductor on the transmission-side filter 20 and is more effective.

In the present preferred embodiment, the matching inductor 41 is connected to the filter inductor 231 connected to only a single parallel arm resonator, the parallel arm resonator 221. However, even in a case in which the matching inductor 41 is connected to a filter inductor connected to a plurality of parallel arm resonators, a similar advantageous effect is able to be obtained. However, it should be noted that the use of a configuration according to the present preferred embodiment is able to further reduce the influence of the connection between the matching inductor 41 and a filter inductor on the transmission-side filter 20 and is more effective.

In the present preferred embodiment, a duplexer is used as an elastic wave filter. However, a similar configuration may be applied to a multiplexer e.g. a triplexer and the above-described advantageous effects are able to be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter apparatus comprising:
   an antenna terminal connected to an antenna;
   a plurality of bandpass filters connected in common to the antenna terminal; and
   a matching circuit connected between the antenna terminal and a common node of the bandpass filters; wherein at least one of the plurality of bandpass filters includes a ladder circuit including at least one series arm elastic wave resonator and at least one parallel arm elastic wave resonator, and a filter inductor connected between the at least one parallel arm elastic wave resonator and a ground potential;

the matching circuit includes a matching inductor that is connected between a transmission line connecting the common node and the antenna terminal and a terminal of the filter inductor on a side of the at least one parallel arm elastic wave resonator;

the at least one parallel arm elastic wave resonator includes a plurality of parallel arm elastic wave resonators;

the filter inductor includes a first filter inductor and a second filter inductor;

the first filter inductor is connected to only one of the plurality of parallel arm elastic wave resonators;

the matching inductor is connected between the transmission line and the first filter inductor; and the one of the plurality of parallel arm elastic wave resonators to which the first filter inductor is connected is nearer to the common node than a parallel arm elastic wave resonator of the plurality of parallel arm elastic wave resonators to which the second filter inductor is connected.

2. The elastic wave filter apparatus according to claim 1, wherein the at least one of the bandpass filters is a transmission-side filter.

3. The elastic wave filter apparatus according to claim 1, wherein each of the at least one parallel arm elastic wave resonator and the at least one series arm resonator is a surface acoustic wave resonator.

4. The elastic wave filter apparatus according to claim 1, wherein each of the plurality of parallel arm elastic wave resonators and the plurality of series arm resonators is a surface acoustic wave resonator.

5. The elastic wave filter apparatus according to claim 1, wherein one of the plurality of bandpass filters is a reception-side filter.

6. The elastic wave filter apparatus according to claim 1, further comprising:
a circuit board; and
a piezoelectric device connected to the circuit board; wherein
the at least one parallel arm elastic wave resonator and the at least one series arm resonator are included in the piezoelectric device.

7. The elastic wave filter apparatus according to claim 1, further comprising:
a circuit board; and
a piezoelectric device connected to the circuit board; wherein
the plurality of parallel arm elastic wave resonators and the plurality of series arm resonators are included in the piezoelectric device.

* * * * *